(12) United States Patent
Jo et al.

(10) Patent No.: US 12,113,058 B2
(45) Date of Patent: Oct. 8, 2024

(54) DISPLAY DEVICE WITH A STATIC ELECTRICITY DISCHARGING CIRCUIT

(71) Applicant: Samsung Display Co., LTD., Yongin-si (KR)

(72) Inventors: Kang Moon Jo, Hwaseong-si (KR); An Su Lee, Seoul (KR); June Whan Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 17 days.

(21) Appl. No.: 17/215,682

(22) Filed: Mar. 29, 2021

(65) Prior Publication Data

US 2021/0327868 A1    Oct. 21, 2021

(30) Foreign Application Priority Data

Apr. 16, 2020 (KR) .......................... 10-2020-0046070

(51) Int. Cl.
*H01L 27/02* (2006.01)

(52) U.S. Cl.
CPC ...... *H01L 27/0255* (2013.01); *H01L 27/0292* (2013.01); *H01L 27/0288* (2013.01); *H01L 27/0296* (2013.01)

(58) Field of Classification Search
CPC ............. H01L 27/0255; H01L 27/0292; H01L 257/43
USPC .......................................................... 257/43
See application file for complete search history.

(56) References Cited

U.S. PATENT DOCUMENTS

| 5,985,722 | A  | * | 11/1999 | Kishi ................. H01L 27/0251 438/307 |
| 9,607,978 | B2 |   | 3/2017  | Deval et al. |
| 2004/0217424 | A1 | * | 11/2004 | Shih ................. H01L 29/41733 257/E29.117 |
| 2005/0140836 | A1 | * | 6/2005 | Choi ................. G02F 1/136204 349/40 |
| 2006/0023135 | A1 | * | 2/2006 | Park ................. G02F 1/136204 349/40 |
| 2008/0170013 | A1 | * | 7/2008 | Jeong ................. H01L 27/0248 345/82 |
| 2009/0026454 | A1 | * | 1/2009 | Kurokawa ........ H01L 29/78696 257/E33.001 |

(Continued)

FOREIGN PATENT DOCUMENTS

| CN | 100529925 | * | 8/2009 |
| JP | 3395473 | * | 2/2003 |

(Continued)

*Primary Examiner* — Sheng-Bai Zhu
(74) *Attorney, Agent, or Firm* — KILE PARK REED & HOUTTEMAN PLLC

(57) ABSTRACT

A display device includes a substrate including a display area and a non-display area; a semiconductor layer including a source area, a channel area, and a drain area and disposed in the non-display area of the substrate; a gate electrode overlapping the channel area of the semiconductor layer; a gate insulating layer disposed between the gate electrode and the channel area of the semiconductor layer; a source electrode electrically connected to the source area of the semiconductor layer; and a drain electrode electrically connected to the drain area of the semiconductor layer, wherein a lateral side of the gate electrode overlaps the drain electrode.

17 Claims, 9 Drawing Sheets

(56) References Cited

U.S. PATENT DOCUMENTS

| | | | |
|---|---|---|---|
| 2011/0068388 A1* | 3/2011 | Yamazaki | H01L 21/02595 |
| | | | 257/E21.414 |
| 2011/0193837 A1* | 8/2011 | Sato | H01L 27/124 |
| | | | 345/205 |
| 2013/0021295 A1* | 1/2013 | Kimura | G06F 3/0412 |
| | | | 345/173 |
| 2013/0093739 A1* | 4/2013 | Kim | G09G 3/3648 |
| | | | 345/206 |
| 2014/0240631 A1* | 8/2014 | Shishido | H01L 29/66 |
| | | | 349/43 |
| 2016/0071834 A1* | 3/2016 | Zhang | H01L 27/0266 |
| | | | 438/158 |
| 2017/0162605 A1* | 6/2017 | Yamamoto | G09G 3/3677 |
| 2018/0129107 A1* | 5/2018 | Hong | H01L 27/0292 |

FOREIGN PATENT DOCUMENTS

| | | | |
|---|---|---|---|
| JP | 2018-174352 | | 11/2018 |
| KR | 2015079217 | * | 7/2015 |
| KR | 10-2018-0024910 | | 3/2018 |
| KR | 10-1940978 | | 1/2019 |
| KR | 10-2040011 | | 11/2019 |

* cited by examiner

DISPLAY DEVICE WITH A STATIC ELECTRICITY DISCHARGING CIRCUIT

CROSS-REFERENCE TO RELATED APPLICATION(S)

This application claims priority to and benefits of Korean Patent Application No. 10-2020-0046070 under 35 U.S.C. § 119 filed in the Korean Intellectual Property Office on Apr. 16, 2020, the entire contents of which are incorporated herein by reference.

BACKGROUND

1. Technical Field

The disclosure relates to a display device and to a display device including a static electricity discharging circuit.

2. Description of the Related Art

A display device may include pixels and signal lines electrically connected to the pixels. The pixels may be arranged on a substrate in a matrix form, and the signal lines may also be arranged in a row direction and/or a column direction. The signal lines may input static electricity to an internal circuit, and the static electricity may damage various electrical elements of the display device.

The signal lines may be electrically connected to the static electricity discharging circuit so that the static electricity may not be input to the internal circuit but may be quickly discharged.

The above information disclosed in this background section is only for enhancement of understanding of the background of the disclosure, and therefore it may contain information that does not form the prior art that may already be known to a person of ordinary skill in the art.

SUMMARY

The disclosure has been made in an effort to provide a static electricity discharging circuit including a diode that may be stably operable by increasing a threshold voltage, and a display device including the same.

An embodiment of the disclosure provides a display device that may include a substrate including a display area and a non-display area; a semiconductor layer including a source area, a channel area, and a drain area, and disposed in the non-display area of the substrate; a gate electrode overlapping the channel area of the semiconductor layer; a gate insulating layer disposed between the gate electrode and the channel area of the semiconductor layer; a source electrode electrically connected to the source area of the semiconductor layer; and a drain electrode electrically connected to the drain area of the semiconductor layer, wherein a lateral side of the gate electrode may overlap the drain electrode.

An upper side of the gate electrode may overlap the drain electrode in a direction perpendicular to the substrate.

An entire upper side of the gate electrode overlapping the channel area may overlap the drain electrode in the direction perpendicular to the substrate.

The gate electrode may include a portion that overlaps the drain electrode in the direction perpendicular to the substrate, and another portion that does not overlap the drain electrode in the direction perpendicular to the substrate.

The semiconductor layer may include an oxide semiconductor.

The source electrode and the drain electrode may include titanium.

The gate electrode may include an expansion not overlapping the semiconductor layer in a direction perpendicular to the substrate, and the expansion of the gate electrode may overlap the drain electrode in the direction perpendicular to the substrate.

An interlayer insulating layer may be disposed between the expansion of the gate electrode and the drain electrode, the interlayer insulating layer may include an opening, and the expansion of the gate electrode may be electrically connected to the drain electrode in the opening.

The semiconductor layer, the gate electrode, the source electrode, and the drain electrode may form a transistor, and a threshold voltage of the transistor may be equal to or greater than about 0.55 V.

The display device may further include a source line disposed in a first direction, and a power supply line disposed in a second direction, wherein the source electrode may be electrically connected to the source line, and the drain electrode may be electrically connected to the power supply line through a connecting member.

An interlayer insulating layer may be disposed between the gate electrode and the drain electrode, the interlayer insulating layer may include an opening, and the gate electrode may be electrically connected to the drain electrode in the opening.

An embodiment provides a display device that may include a display unit that displays images; and a static electricity prevention circuit disposed on a lateral side of the display unit. The static electricity prevention circuit may include a first diode electrically connected to a first power supply line; and a second diode electrically connected to a second power supply line. Each of the first diode and the second diode may include a substrate; a semiconductor layer including a source area, a channel area, and a drain area, and disposed on the substrate; a gate electrode overlapping the channel area of the semiconductor layer; a gate insulating layer disposed between the gate electrode and the channel area of the semiconductor layer; a source electrode electrically connected to the source area of the semiconductor layer, and a drain electrode electrically connected to a drain area of the semiconductor layer. A lateral side of the gate electrode may overlap the drain electrode.

A voltage applied to the second power supply line may be higher than a voltage applied to the first power supply line.

Static electricity may be discharged to the first power supply line through a first diode when static electricity input to the static electricity prevention circuit is lower than a voltage applied to the first power supply line, and static electricity may be discharged to the second power supply line through a second diode when the static electricity input to the static electricity prevention circuit is greater than a voltage applied to the second power supply line.

An upper side of the gate electrode may overlap the drain electrode in a direction perpendicular to the substrate.

The semiconductor layer may include an oxide semiconductor, and the source electrode and the drain electrode may include titanium.

The gate electrode may include an expansion not overlapping the semiconductor layer in a direction perpendicular to the substrate, and the expansion of the gate electrode may overlap the drain electrode in the direction perpendicular to the substrate.

An interlayer insulating layer may be disposed between the expansion of the gate electrode and the drain electrode, the interlayer insulating layer may include an opening, and the expansion of the gate electrode may be electrically connected to the drain electrode in the opening.

A threshold voltage of at least one of the first diode and the second diode may be equal to or greater than about 0.55 V.

An interlayer insulating layer may be disposed between the gate electrode and the drain electrode, the interlayer insulating layer may include an opening, and the gate electrode may be electrically connected to the drain electrode in the opening.

According to embodiments, the static electricity preventing or prevention circuit may include a diode stably operable by increasing the threshold voltage, and a display device including the same.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
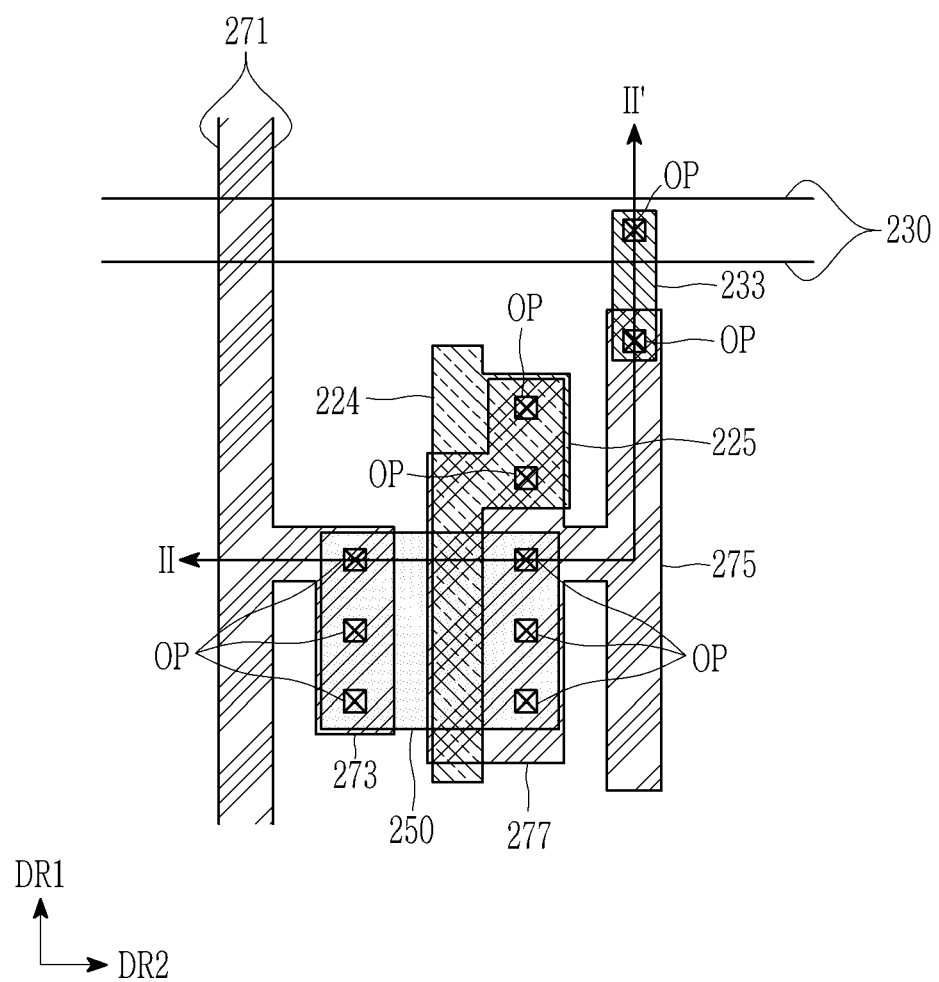
FIG. 1 shows a plan view of a static electricity discharging circuit according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

Parts that are irrelevant to the description will be omitted to clearly describe the disclosure, and the same elements will be designated by the same reference numerals throughout the specification.

The size and thickness of elements shown in the drawings are arbitrarily shown for better understanding and ease of description, but the disclosure is not limited thereto. In the drawings, the thickness of layers, films, panels, areas, etc., are exaggerated for clarity. The thicknesses of some layers and areas are exaggerated for convenience of explanation.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

While such terms as "first," "second," etc., may be used to describe various components, such components are not be limited to the above terms. The above terms are used only to distinguish one component from another. For example, a first element referred to as a first element in one embodiment may be referred to as a second element in another embodiment without departing from the scope of the appended claims.

It will be understood that when an element such as a layer, film, area, or substrate is referred to as being "on" another element, it may be directly on the other element or intervening elements may also be present. In contrast, when an element is referred to as being "directly on" another element, there are no intervening elements present. The word "on" or "above" means positioned on or below an object, and does not necessarily mean positioned on the upper side of the object based on a gravitational direction.

Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

Unless explicitly described to the contrary, the word "comprise" and variations such as "comprises" or "comprising", "include" and its variations such as "includes" or "including", "have" or "having" will be understood to imply the inclusion of stated elements but not the exclusion of any other elements.

The phrase "in a plan view" means viewing the object from the top, and the phrase "in a schematic cross-sectional view" means viewing a cross-section of which the object is vertically cut from the side.

Throughout the specification, when it is described that a part is "connected (in contact with, coupled)" to another part, the part may be "directly connected" to the other element, may be "connected" to the other part through a third part, or may be connected to the other part physically or electrically, and they may be referred to by different titles depending on positions or functions, but respective portions that are substantially integrated into one body may be connected to each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

As used herein, the term "unit" denotes a structure or element as illustrated in the drawings and as described in the specification. However, the disclosure is not limited thereto. The term "unit" is not to be limited to that which is illustrated in the drawings.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The disclosure relates to a static electricity discharging circuit of a display device with a static electricity discharging circuit, and it relates to a display device in which a transistor of a static electricity discharging circuit covers or overlaps an upper side of a gate electrode with a drain electrode.

Figure 2:
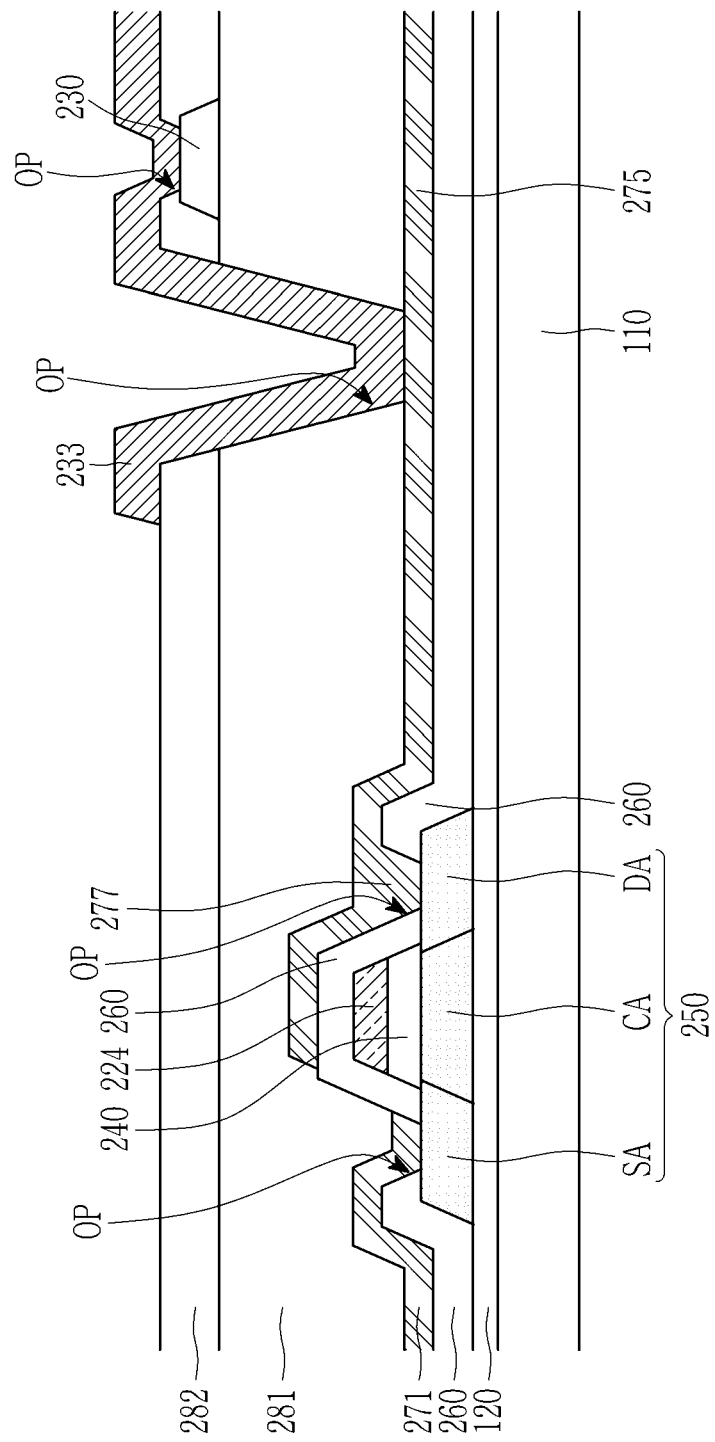
FIG. 2 shows a schematic cross-sectional view of FIG. 1 with respect to a line II-II'.

FIG. 1 shows a plan view of a static electricity discharging circuit according to an embodiment. FIG. 2 shows a schematic cross-sectional view of FIG. 1 with respect to a line II-II'.

To be described later in reference to FIG. 4 and FIG. 5, the static electricity discharging circuit according to an embodiment may be on a first static electricity discharging unit (ESD_1) or a second static electricity discharging unit (ESD_2) positioned or disposed outside of the display unit (DA) of a display device 1000. A structure of the entire display device including the display unit (DA) and the static electricity discharging units (ESD_1 and ESD_2) will be described later.

Referring to FIG. 1, the static electricity discharging circuit may include a source line 271, and a power supply line 230 crossing or intersecting the source line 271. The source line 271 may extend in a first direction DR1, and the power supply line 230 may extend in a second direction DR2 that may be substantially perpendicular to the first direction DR1. To be described below in detail, static electricity input through the source line 271 may be discharged to the power supply line 230 through a transistor shown in FIG. 1.

Referring to FIG. 1 and FIG. 2, a buffer layer 120 may be positioned or disposed on a substrate 110. The substrate 110 may include glass or plastic, and may be flexible. The buffer layer 120 may include a silicon nitride or a silicon oxide.

A semiconductor layer 250 may be positioned or disposed on the buffer layer 120. As shown in FIG. 1, the semiconductor layer 250 may have a substantially quadrangular shape with similar lengths in the first direction DR1 and the second direction DR2. However, the shape of the semiconductor layer 250 shown in FIG. 1 is by way of example, and the semiconductor layer 250 may have a substantially rectangular shape in which the length in the second direction DR2 may be greater than the length in the first direction DR1.

The semiconductor layer 250 may include a source area (SA), a channel area (CA), and a drain area (DA). The semiconductor layer 250 may include an oxide semiconductor.

Referring to FIG. 1 and FIG. 2, a gate insulating layer 240 may be positioned or disposed in the channel area (CA) of the semiconductor layer 250. A gate electrode 224 may be positioned or disposed on the gate insulating layer 240. The gate insulating layer 240 may have a substantially similar planar shape to the gate electrode 224. The gate electrode 224 may overlap the channel area (CA) of the semiconductor layer 250 and the substrate 110 in a substantially perpendicular direction with the gate insulating layer 240 disposed therebetween.

Referring to FIG. 1, the gate electrode 224 may include an expansion 225 positioned or disposed in an area not overlapping the semiconductor layer 250. To be described below in detail, the expansion 225 of the gate electrode 224 may overlap an expansion 277 of a drain electrode 275 and the substrate 110 in a substantially perpendicular direction.

Referring to FIG. 1 and FIG. 2, an interlayer insulating layer 260 may be positioned or disposed on the gate insulating layer 240 and the gate electrode 224. The interlayer insulating layer 260 may include openings OP. The openings OP of the interlayer insulating layer 260 may be positioned or disposed to overlap the semiconductor layer 250. In the respective openings OP of the interlayer insulating layer 260, the source area (SA) of the semiconductor layer 250 may be electrically connected to the source electrode 273, and the drain area (DA) of the semiconductor layer 250 may be electrically connected to the drain electrode 275.

There may be eight or more openings OP in the interlayer insulating layer 260 in FIG. 1, but this is just an example, and the number of openings OP is variable depending on an embodiment.

Part of the source line 271 in parallel to the first direction DR1 may protrude in the second direction DR2 to form a source electrode 273. The drain electrode 275 may be positioned or disposed in parallel to the first direction DR1, and part of the drain electrode 275 may protrude in the second direction DR2 to overlap the semiconductor layer 250.

The drain electrode 275 may be separated from the source line 271 to be positioned or disposed with an island or isolated shape. The drain electrode 275 may be electrically connected to the power supply line 230 through a connecting member 233. Therefore, the static electricity input to the source line 271 may be supplied to the power supply line 230 through the drain electrode 275. The source line 271 and the drain electrode 275 may include titanium (Ti).

Referring to FIG. 2, a first insulating layer 281 may be positioned or disposed on the source line 271 and the drain electrode 275. The power supply line 230 may be formed or disposed on the first insulating layer 281. The power supply line 230 may be positioned or disposed in the second direction DR2.

A second insulating layer 282 may be formed or disposed on the power supply line 230. The connecting member 233 may be formed or disposed on the second insulating layer 282. The first insulating layer 281 and the second insulating layer 282 may include openings OP. The connecting member 233 may be electrically connected to the power supply line 230 through the opening OP in the second insulating layer 282. The connecting member 233 may be electrically connected to the drain electrode 275 through the openings OP in the first insulating layer 281 and the second insulating layer 282. For example, the connecting member 233 may electrically connect the drain electrode 275 and the power supply line 230.

Therefore, the static electricity input to the source line 271 may pass through the drain electrode 275 and may be supplied to the power supply line 230 through the connecting member 233.

Referring to FIG. 1 and FIG. 2, regarding the display device, an upper side and a lateral side of the gate electrode 224 may be covered or overlapped by the expansion 277 of the drain electrode 275. As shown in FIG. 2, the upper side of the gate electrode 224 overlaps the expansion 277 of the drain electrode 275 in a direction perpendicular to the substrate 110. One or a lateral side of the gate electrode 224, which may be near the drain electrode 275, may overlap the expansion 277 of the drain electrode 275. As shown in FIG. 1, the expansion 277 of the drain electrode 275 may be electrically connected to the expansion 225 of the gate electrode 224 through the opening OP in the interlayer insulating layer 260.

The static electricity preventing or prevention circuit in which the upper side and the lateral side of the gate electrode 224 may be covered or overlapped by the expansion 277 of the drain electrode 275 may increase the threshold voltage of the transistor and may stably block the static electricity.

For example, to be described in detail with an additional equivalent circuit diagram, regarding the static electricity preventing or prevention circuit according to an embodiment, the transistor may be operated as a diode to discharge the input static electricity to the power supply line 230. However, in a case that the semiconductor layer 250 may include an oxide semiconductor, the threshold voltage of the transistor may be low and performance of the diode may be unstable.

However, the static electricity preventing or prevention circuit according to an embodiment may increase the threshold voltage of the static electricity preventing or prevention circuit by covering or overlapping the upper side and the lateral side of the gate electrode 224 with the drain electrode 275. Hence, the static electricity preventing or prevention circuit may be stably operable.

Figure 3:
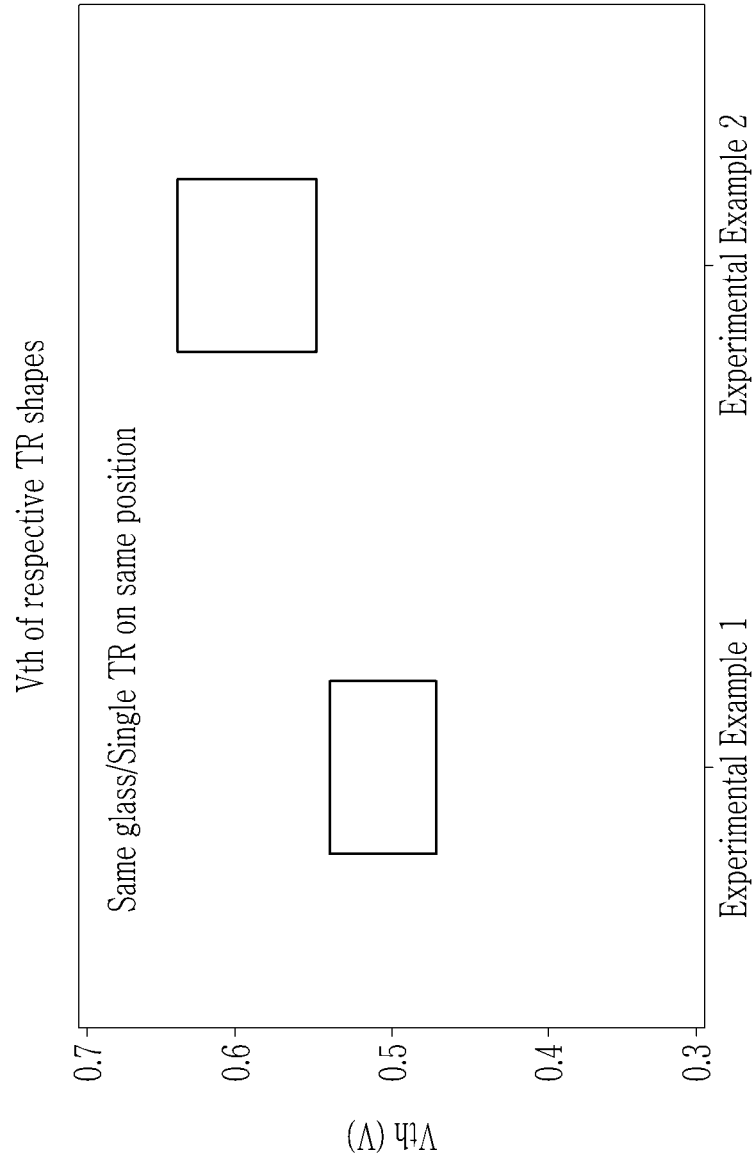
FIG. 3 shows a measurement of a threshold voltage for Experimental Example 1 in which an upper side and a lateral side of a gate electrode are not covered or overlapped by a drain electrode, and Experimental Example 2 in which the upper side and the lateral side of the gate electrode is covered or overlapped by the drain electrode under the same condition, and the results.

FIG. 3 shows a measurement of a threshold voltage Vth for Experimental Example 1 in which an upper side and a lateral side of a gate electrode 224 are not covered or overlapped by a drain electrode 275 and Experimental Example 2 in which the upper side and the lateral side of the gate electrode 224 are covered or overlapped by the drain electrode 275 under the same condition, and the results. Respective experimental examples are measured multiple times, and a range of the measured threshold voltages is shown. Referring to FIG. 3, it is determined that Experimental Example 2 in which the upper side and the lateral side of the gate electrode 224 are covered or overlapped by the drain electrode 275 has a higher threshold voltage Vth than Experimental Example 1 in which an upper side and a lateral side of a gate electrode 224 are not covered or overlapped by a drain electrode 275.

The threshold voltage Vth of Experimental Example 2 in which the upper side and the lateral side of the gate electrode 224 are covered or overlapped by the drain electrode 275 is shown to be in a range of about 0.55 V to about 0.65 V. This numerical value is higher than a range of about 0.45 V to about 0.53 V which is the threshold voltage Vth of Experimental Example 1 in which the upper side and the lateral side of the gate electrode 224 are not covered or overlapped by the drain electrode 275.

This is because titanium (Ti) included in the drain electrode 275 may generate an activity difference of protons H+ included in the interlayer insulating layer 260 positioned or disposed between the drain electrode 275 and the semiconductor layer 250.

The static electricity preventing or prevention circuit according to an embodiment may increase the threshold voltage Vth of the transistor TR and may stably block the static electricity as the upper side and the lateral side of the gate electrode 224 of the transistor are covered or overlapped by the drain electrode 275.

An entire configuration of a display device including a static electricity preventing or prevention circuit according to an embodiment will now be described with reference to the drawings. However, the configuration to be described below is an example, and the disclosure is not limited thereto.

Figure 4:
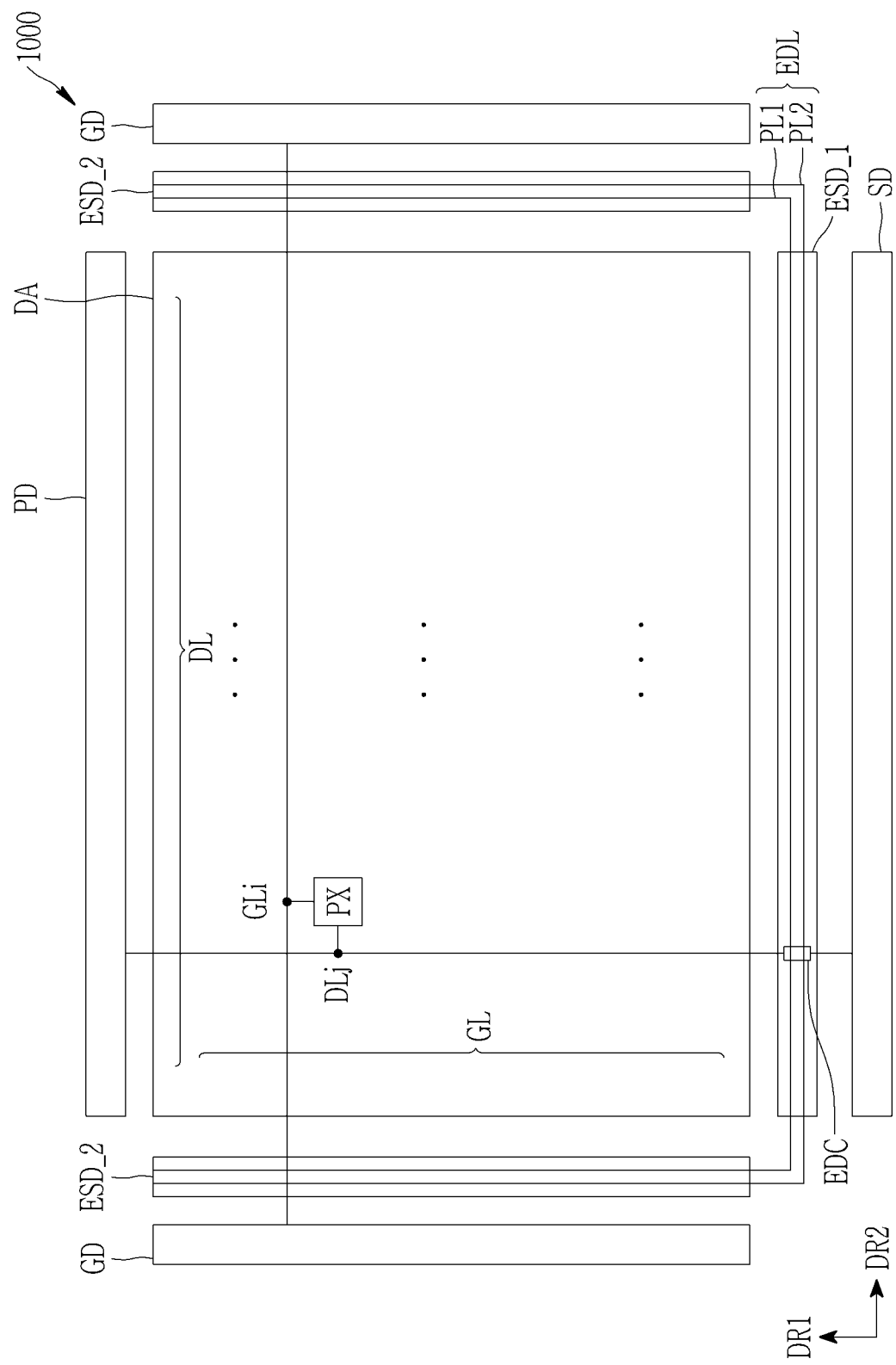
FIG. 4 shows a block diagram of a display device according to an embodiment.

FIG. 4 shows a block diagram of a display device according to an embodiment. Referring to FIG. 4, the display device 1000 may include a display unit (DA), a source driver (SD), and a gate driver (GD). The display device 1000 may include a first static electricity discharging unit (ESD_1), a pad (PD), and a second static electricity discharging unit (ESD_2).

The display unit (DA) may include pixels PXs arranged or disposed in a matrix form. The pixels PXs may be respectively electrically connected to the gate lines (GL) and the data lines (DL). FIG. 4 exemplifies one or a pixel PX electrically connected to the gate line (GLi) and the data line (DLj), and pixels PX may be disposed at positions where the gate lines (GL) cross the data lines (DL) in the display unit (DA). The gate line (GL) may be parallel to the second direction DR2, and the data line (DL) may be parallel to the first direction DR1.

The respective gate lines (GL) may transmit gate signals output by the gate driver (GD) to pixels PX in a same row, and the respective data lines (DL) may transmit a gray voltage signal output by the source driver (SD) to pixels PX in a same column. In FIG. 4, the gate line (GLi) is illustrated as a single line, but gate lines may be electrically connected to one or a pixel PX depending on a driving circuit of the pixel PX so as to transmit parallel control signals.

Referring to FIG. 4, the source driver (SD) and the gate driver (GD) may be controlled by a controller (not shown). The controller may receive timing signals such as a vertical synchronization signal Vsync, a horizontal synchronizing signal Hsync, a data enable signal (DE), clock signals (CLK), and data signals (RGB). The controller may control operational timing of the gate driver (GD) and the source driver (SD) by using the timing signals. The data signals (RGB) include luminance information of the pixels PX. The luminance may have a predetermined number of grays, for example, 1024 (=$2^{10}$), 256 (=$2^8$), or 64 (=$2^6$).

The controller may generate control signals including a gate timing control signal for controlling operational timing of the gate driver (GD) and a data timing control signal for controlling operational timing of the source driver (SD), and may provide them to the gate driver (GD) and the source driver (SD).

The gate driver (GD) may sequentially generate control signals for operating the transistors of the pixels PX included in the display unit (DA) in response to the gate timing control signal. The gate driver (GD) may provide control signals to the pixels PX through the gate lines (GL).

The first static electricity discharging unit (ESD_1) may include static electricity discharging circuits (EDC) electrically connected to the data lines (DL). The data lines (DL) may extend in the first direction DR1 in the display unit (DA). External static electricity may be input through the data line (DL), and the static electricity may destroy elements in the display unit (DA). For example, gate insulating layers of the transistors in the pixel PX may be destroyed by static electricity. The respective static electricity discharging circuits (EDC) may discharge the static electricity input to the corresponding data lines (DL) to a static electricity discharging line (EDL).

The static electricity discharging line (EDL) may include a first power supply line PL1 for applying a first power supply voltage (VSS) and a second power supply line PL2 for applying a second power supply voltage (VDD). The static electricity discharging line (EDL) positioned or disposed in the first static electricity discharging unit (ESD_1) may be referred to as a first static electricity discharging line. The static electricity with a positive voltage input to the data line (DL) may be discharged to the second power supply line PL2 through the static electricity discharging circuit (EDC), and the static electricity with a negative voltage may be discharged to the first power supply line PL1.

The respective static electricity discharging circuits (EDC) may be electrically connected to the corresponding data lines (DL) or the static electricity discharging line (EDL) through a bridge structure including a conductive pattern on the insulating layer covering or overlapping the corresponding data line (DL) and the static electricity discharging line (EDL).

The static electricity discharging circuits (EDC) of the first static electricity discharging unit ESD_1 may be referred to as first static electricity discharging circuits. Descriptions on the static electricity discharging circuits (EDC) correspond to those provided with reference to FIG. 1 and FIG. 2. For example, the source line 271 shown in FIG. 1 may be electrically connected to the data line (DL) shown in FIG. 4 and may receive static electricity supplied from the outside. The input static electricity may pass through the drain electrode 275 shown in FIG. 1 and may be transmitted to the power supply line 230, and the power supply line 230 may be electrically connected to the static electricity discharging line (EDL) shown in FIG. 4.

FIG. 1 and FIG. 2 show one or a transistor from among the static electricity discharging circuit, and the static electricity discharging circuit may include two transistors which may be parallel to each other in the first direction DR1. The respective transistors may be electrically connected to the first power supply line PL1 and the second power supply line PL2, and static electricity may be transmitted to different power supply lines depending on an amount of input static electricity.

The first static electricity discharging unit (ESD_1) may be disposed between the data line (DL) and the source driver (SD), and the pad (PD) may be disposed on an opposite side of the first static electricity discharging unit (ESD_1). The pad (PD) may be provided in the process for manufacturing a display device 1000, and it may be removed from the final display device 1000.

The second static electricity discharging unit (ESD_2) may include static electricity discharging circuits (not shown) electrically connected to the gate lines (GL). As shown in FIG. 4, the gate driver (GD) may be on respective sides of the display unit (DA), and the second static electricity discharging unit (ESD_2) may be on respective sides of the display unit (DA). In a case that the gate driver (GD) is disposed on one or a side of the display unit (DA), the second static electricity discharging unit (ESD_2) may be disposed on one or a side of the display unit (DA) between the gate driver (GD) of the display unit (DA). The static electricity discharging circuits of the second static electricity discharging unit (ESD_2) may have a substantially same circuit configuration as the static electricity discharging circuits in the first static electricity discharging unit (ESD_1) except that they may be electrically connected to the gate line (GL) and not the data line (DL).

The respective static electricity discharging circuits in the second static electricity discharging unit (ESD_2) may discharge the static electricity input to the gate line (GL) to the static electricity discharging line (EDL). The respective static electricity discharging circuits in the second static electricity discharging unit (ESD_2) may be electrically connected to the corresponding gate line (GL) or the static electricity discharging line (EDL) through a bridge structure including a conductive pattern on the insulating layer covering or overlapping the gate line (GL) and the static electricity discharging line (EDL). As described above, the static electricity discharging line (EDL) may include a first power supply line PL1 for applying a first power supply voltage (VSS) and a second power supply line PL2 for applying a second power supply voltage (VDD).

The static electricity discharging circuits in the second static electricity discharging unit (ESD_2) may be referred to as second static electricity discharging circuits. The static electricity discharging line (EDL) positioned or disposed in the second static electricity discharging unit (ESD_2) may be referred to as a second static electricity discharging line.

In the specification, the static electricity discharging circuit (EDC) electrically connected to the data line (DL) is mainly described. This is, however, an example, and the static electricity discharging circuit (EDC) may be electrically connected to the gate line (GL) in the second static electricity discharging unit (ESD_2) and may discharge the static electricity input to the gate line (GL) to the static electricity discharging line.

An operation of a static electricity discharging circuit (EDC) according to an embodiment will now be described with reference to an equivalent circuit diagram.

Figure 5:
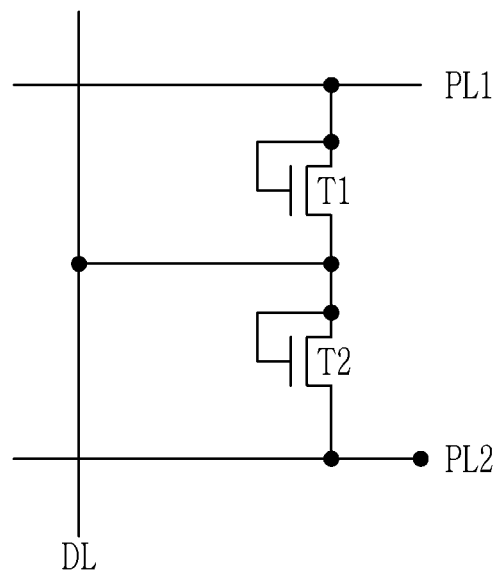
FIG. 5 shows an equivalent circuit diagram of a static electricity discharging circuit according to an embodiment.

FIG. 5 shows an equivalent circuit diagram of a static electricity discharging circuit according to an embodiment.

Referring to FIG. 5, the static electricity discharging circuit may include a data line (DL), a first power supply line PL1, and a second power supply line PL2. As shown in FIG. 5, the static electricity discharging circuit may include a first static electricity discharging diode T1 electrically connected between the data line (DL) and the first power supply line PL1, and a second static electricity discharging diode T2 electrically connected between the data line (DL) and the second power supply line PL2.

A first power supply voltage (VSS) may be applied to the first power supply line PL1, and a second power supply voltage (VDD) may be applied to the second power supply line PL2. The second power supply voltage (VDD) may have a higher voltage level than the first power supply voltage (VSS).

The first power supply voltage (VSS) may be a same voltage as the first driving voltage (ELVSS), and the second power supply voltage (VDD) may be a same voltage as the second driving voltage (ELVDD).

The voltage level of the data voltage signal flowing through the data line (DL) may be less than the voltage level of the second power supply voltage (VDD) and greater than the voltage level of the first power supply voltage (VSS). Therefore, in a case that the data voltage signal is transmitted through the data line (DL), the first static electricity discharging diode T1 and the second static electricity discharging diode T2 may be turned off.

However, in a case that static electricity with a positive voltage is input to the data line (DL), the second static electricity discharging diode T2 may be turned on by the positive voltage of the static electricity, and the static electricity may be discharged to the second power supply line PL2 through the second static electricity discharging diode T2. On the contrary, in a case that static electricity with a negative voltage is input to the data line (DL), the first static electricity discharging diode T1 may be turned on by the negative voltage of the static electricity, and the static electricity may be discharged to the first power supply line PL1 through the first static electricity discharging diode T1. Therefore, the static electricity input from the outside may be prevented from being input to the display area.

Figure 6:
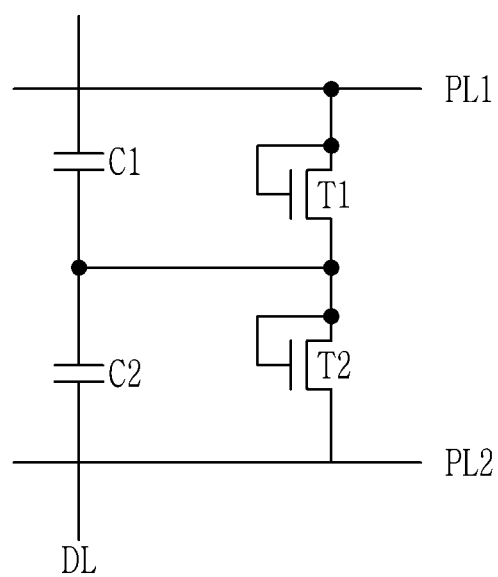
FIG. 6 shows an equivalent circuit diagram of a static electricity discharging circuit including a capacitor.

The static electricity discharging circuit according to an embodiment may include capacitors C1 and C2 positioned or disposed in the data line (DL). FIG. 6 shows an equivalent circuit diagram of a static electricity discharging circuit including a capacitor. As shown in FIG. 6, in a case that the static electricity discharging circuit may include a capacitor, the static electricity may be efficiently blocked in a floating state in which no power may be supplied. For example, a diode insulation breaking phenomenon may be prevented by coupling by the capacitor, and the capacitor may function as a buffer on the static electricity, thereby reducing a peak voltage.

The static electricity discharging circuit according to an embodiment may increase the threshold voltage of the transistor as the expansion 277 of the drain electrode 275 overlaps the upper side and the lateral side of the gate electrode 224, so the static electricity discharging circuit may be stably operable.

FIG. 1 and FIG. 2 illustrate an embodiment in which the expansion 277 of the drain electrode 275 may cover or overlap the upper side and the lateral side of the gate electrode 224, and the same effect may be achievable in a case that the expansion 277 of the drain electrode 275 may cover or overlap the lateral side of the gate electrode 224 and may not completely cover or overlap the upper side.

Figure 7:
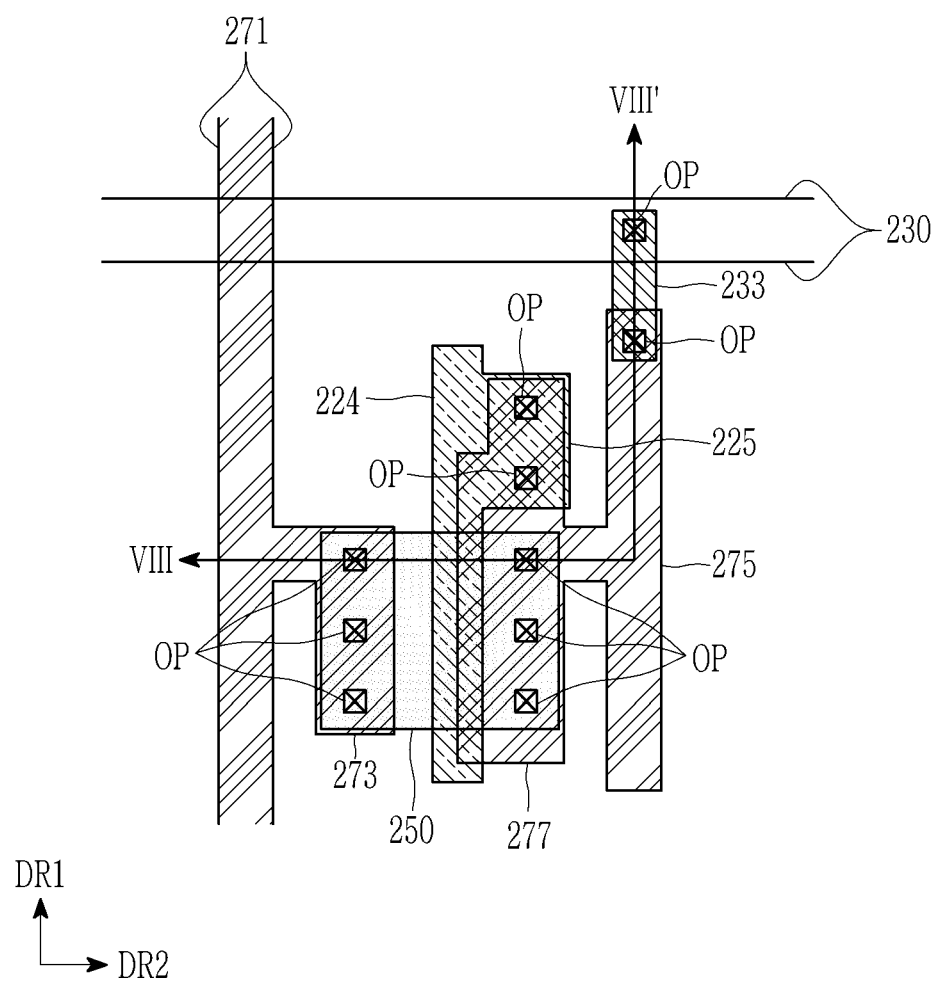
FIG. 7 shows a same area or region as that of FIG. 1 according to an embodiment.
Figure 8:
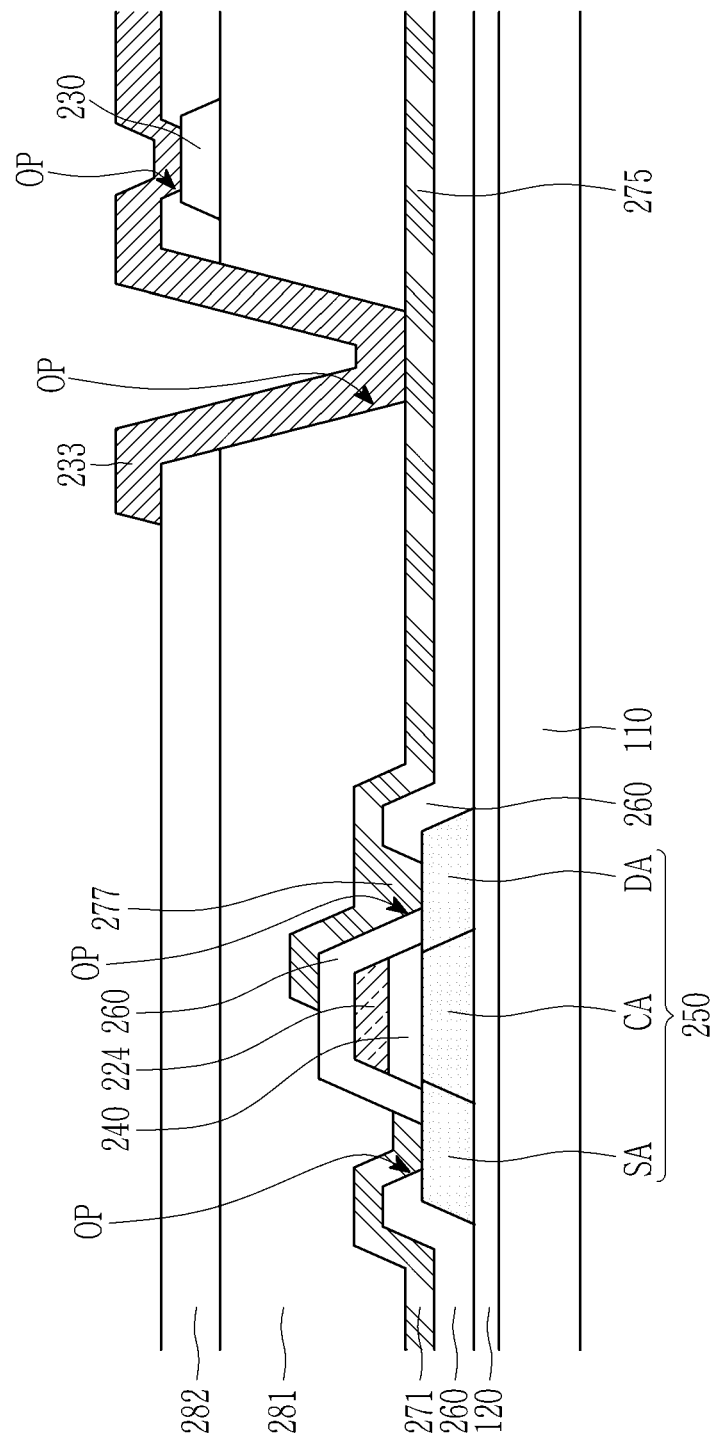
FIG. 8 shows a schematic cross-sectional view with respect to a line VIII-VIII' of FIG. 7.

FIG. 7 shows a same area or region as that of FIG. 1 according to an embodiment. FIG. 8 shows a schematic cross-sectional view with respect to a line VIII-VIII' of FIG. 7.

Referring to FIG. 7 and FIG. 8, the static electricity discharging circuit according to an embodiment corresponds to an embodiment described with reference to FIG. 1 and FIG. 2, except that the expansion 277 of the drain electrode 275 may not cover or overlap the entire upper side of the gate electrode 224 but may cover or overlap part thereof and may cover or overlap the lateral side of the gate electrode 224. Detailed descriptions of the same elements will not be provided.

As shown in FIG. 7 and FIG. 8, in a case that the expansion 277 of the drain electrode 275 may not over or overlap the entire upper side of the gate electrode 224 but may cover or overlap part thereof, and the lateral side of the gate electrode 224 may be covered or overlapped by the expansion 277 of the drain electrode 275, the threshold voltage increasing effect may be obtained in a similar manner as that of FIG. 1 and FIG. 2.

The plan view of the static electricity discharging circuit described with reference to FIG. 1, FIG. 2, FIG. 7, and FIG. 8 are examples, and the disclosure is not limited thereto. For example, the shapes of the semiconductor layer 250 or the expansion 225 of the gate electrode 224 are not limited to the shapes that are illustrated in the previous drawings.

Figure 9:
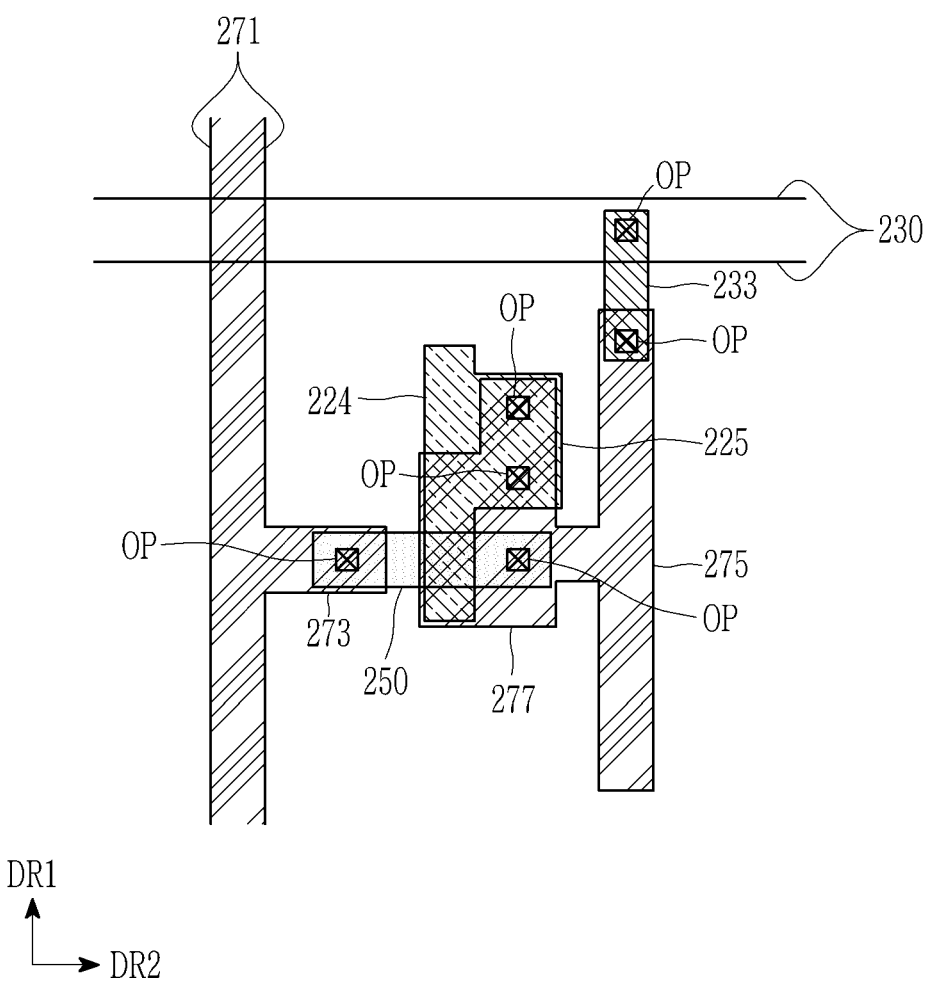
FIG. 9 shows a same area or region as that of FIG. 1 according to an embodiment.

FIG. 9 shows a same area or region as that of FIG. 1 according to an embodiment. Referring to FIG. 9, the static electricity discharging circuit according to an embodiment corresponds to an embodiment described with reference to FIG. 1, except for the shape of the semiconductor layer 250. Detailed descriptions of the same elements will not be provided. The display device according to an embodiment may have a substantially rectangular shape in which a length of the semiconductor layer 250 in the second direction DR2 may be greater than a length thereof in the first direction DR1, and it may be different from that described with reference to FIG. 1 in that the semiconductor layer 250 may overlap two openings OP. However, in an embodiment described with reference to FIG. 9, the lateral side and the upper side of the gate electrode 224 may be covered or overlapped by the expansion 277 of the drain electrode 275, so the same threshold voltage increasing effect as an embodiment described with reference to FIG. 1 may be obtained.

Figure 10:
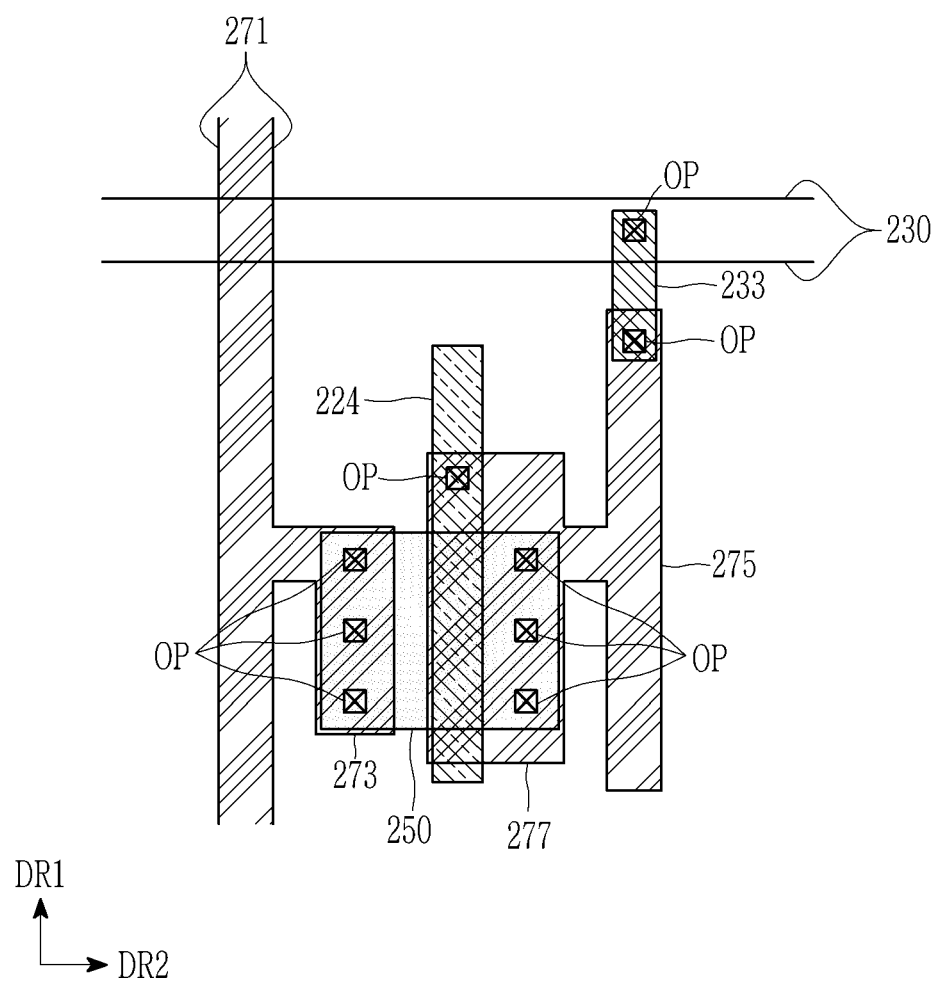
FIG. 10 shows a same area or region as that of FIG. 1 according to an embodiment.

FIG. 10 shows a same area or region as that of FIG. 1 according to an embodiment. Referring to FIG. 10, the static electricity discharging circuit according to an embodiment may correspond to an embodiment described with reference to FIG. 1 except that the gate electrode 224 may not include the expansion 225. Detailed descriptions of the same elements will not be provided. Regarding an embodiment described with reference to FIG. 10, the gate electrode 224 may not include the expansion 225, and may be electrically connected to the drain electrode 275 through the opening OP on the gate electrode 224. However, in an embodiment described with reference to FIG. 10, the lateral side and the upper side of the gate electrode 224 may be covered or overlapped by the expansion 277 of the drain electrode 275, so the same threshold voltage increasing effect as an embodiment described with reference to FIG. 1 may be obtained.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
a substrate including a display area containing a plurality of pixels and a non-display area surrounding the display area;
a semiconductor layer including a transistor having a source area, a channel area, and a drain area, the transistor disposed in the non-display area of the substrate;
a gate electrode of the transistor overlapping the channel area of the semiconductor layer;
a gate insulating layer disposed between the gate electrode and the channel area of the semiconductor layer;
a source electrode electrically connected to the source area of the semiconductor layer; and
a drain electrode electrically connected to the drain area of the semiconductor layer, wherein
both lateral sides of the gate electrode facing each other overlap the drain electrode in a direction perpendicular to the substrate,
the gate electrode includes an expansion not overlapping the semiconductor layer in the direction perpendicular to the substrate,
the expansion of the gate electrode overlaps the drain electrode in the direction perpendicular to the substrate,
an interlayer insulating layer is disposed between the expansion of the gate electrode and the drain electrode,
the interlayer insulating layer includes an opening,
the expansion of the gate electrode is electrically connected to the drain electrode in the opening, and
the gate electrode comprises:
a portion that overlaps the drain electrode in the direction perpendicular to the substrate and another portion that does not overlap the drain electrode in the direction perpendicular to the substrate, the another portion having a wider width than the portion that overlaps the drain electrode.

2. The display device of claim 1, wherein an upper side of the gate electrode overlaps the drain electrode in a direction perpendicular to the substrate.

3. The display device of claim 2, wherein an entire upper side of the gate electrode overlapping the channel area overlaps the drain electrode in the direction perpendicular to the substrate.

4. The display device of claim 1, wherein the semiconductor layer includes an oxide semiconductor.

5. The display device of claim 1, wherein the source electrode and the drain electrode include titanium.

6. The display device of claim 1, wherein a threshold voltage of the transistor is equal to or greater than about 0.55 V.

7. The display device of claim 1, further comprising:
a source line disposed in a first direction, and
a power supply line disposed in a second direction, wherein
the source electrode is electrically connected to the source line, and
the drain electrode is electrically connected to the power supply line through a connecting member.

8. The display device of claim 1, wherein
an interlayer insulating layer is disposed between the gate electrode and the drain electrode,
the interlayer insulating layer includes an opening, and the gate electrode is electrically connected to the drain electrode in the opening.

9. The display device of claim 1, wherein
the gate electrode traverses completely between pixels along a first direction,
the gate electrode completely traverses across the channel area of the semiconductor layer along the first direction, and
the expansion of the gate electrode is defined as a portion of the gate electrode where the gate electrode is wider in a second direction perpendicular to the first direction as compared to a width of the gate electrode that traverses across the channel area.

10. A display device comprising:
a display unit that displays images; and
a static electricity prevention circuit disposed on a lateral side of the display unit, the static electricity prevention circuit including:
a first diode electrically connected to a first power supply line; and
a second diode electrically connected to a second power supply line, wherein
each of the first diode and the second diode includes:
a substrate;
a semiconductor layer including a source area, a channel area, and a drain area, and disposed on the substrate;
a gate electrode overlapping the channel area of the semiconductor layer;
a gate insulating layer disposed between the gate electrode and the channel area of the semiconductor layer;
a source electrode electrically connected to the source area of the semiconductor layer; and
a drain electrode electrically connected to a drain area of the semiconductor layer, wherein
both lateral sides of the gate electrode facing each other overlap the drain electrode in a direction perpendicular to the substrate,
the gate electrode includes an expansion not overlapping the semiconductor layer in the direction perpendicular to the substrate,
the expansion of the gate electrode overlaps the drain electrode in the direction perpendicular to the substrate,
an interlayer insulating layer is disposed between the expansion of the gate electrode and the drain electrode,
the interlayer insulating layer includes an opening,
the expansion of the gate electrode is electrically connected to the drain electrode in the opening, and
the expansion of the gate electrode has a wider width than the portion of the gate electrode that overlaps the drain electrode.

11. The display device of claim 10, wherein a voltage applied to the second power supply line is higher than a voltage applied to the first power supply line.

12. The display device of claim 11, wherein
static electricity is discharged to the first power supply line through a first diode when static electricity input to the static electricity prevention circuit is lower than a voltage applied to the first power supply line, and
static electricity is discharged to the second power supply line through a second diode when the static electricity input to the static electricity prevention circuit is greater than a voltage applied to the second power supply line.

13. The display device of claim 10, wherein an upper side of the gate electrode overlaps the drain electrode in a direction perpendicular to the substrate.

14. The display device of claim 10, wherein
the semiconductor layer includes an oxide semiconductor, and
the source electrode and the drain electrode include titanium.

15. The display device of claim 10, wherein a threshold voltage of at least one of the first diode and the second diode is equal to or greater than about 0.55 V.

16. The display device of claim 10, wherein
an interlayer insulating layer is disposed between the gate electrode and the drain electrode,
the interlayer insulating layer includes an opening, and
the gate electrode is electrically connected to the drain electrode in the opening.

17. The display device of claim 10, wherein
the gate electrode traverses completely between pixels along a first direction,
the gate electrode completely traverses across the channel area of the semiconductor layer along the first direction, and
the expansion of the gate electrode is defined as a portion of the gate electrode where the gate electrode is wider in a second direction perpendicular to the first direction as compared to a width of the gate electrode that traverses across the channel area.

* * * * *